United States Patent
Markle et al.

(10) Patent No.: US 11,243,480 B2
(45) Date of Patent: Feb. 8, 2022

(54) SYSTEM FOR MAKING ACCURATE GRATING PATTERNS USING MULTIPLE WRITING COLUMNS EACH MAKING MULTIPLE SCANS

(71) Applicant: Applied Materials, Inc., Santa Clara, CA (US)

(72) Inventors: David Markle, Pleasanton, CA (US); Hwan J. Jeong, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/057,536

(22) PCT Filed: May 31, 2019

(86) PCT No.: PCT/US2019/035049
§ 371 (c)(1),
(2) Date: Nov. 20, 2020

(87) PCT Pub. No.: WO2020/009762
PCT Pub. Date: Jan. 9, 2020

(65) Prior Publication Data
US 2021/0191285 A1    Jun. 24, 2021

Related U.S. Application Data

(60) Provisional application No. 62/693,787, filed on Jul. 3, 2018.

(51) Int. Cl.
| | | |
|---|---|---|
| *G03F 7/20* | (2006.01) | |
| *G03F 9/00* | (2006.01) | |
| *G02B 5/18* | (2006.01) | |

(52) U.S. Cl.
CPC ......... *G03F 9/7003* (2013.01); *G02B 5/1819* (2013.01); *G02B 5/1842* (2013.01);
(Continued)

(58) Field of Classification Search
CPC .............. G03F 9/7003; G03F 7/70275; G03F 7/70475; G03F 7/70516; G03F 9/7049;
(Continued)

(56) References Cited

U.S. PATENT DOCUMENTS 5,303,001 A * 4/1994 Jeong .................. G02B 17/008
355/1
5,585,972 A * 12/1996 Markle .................. G02B 13/26
359/732
(Continued)

FOREIGN PATENT DOCUMENTS

JP        5276595 B2     8/2013

OTHER PUBLICATIONS

International Search Report and Written Opinion dated Sep. 11, 2019 for Application No. PCT/US2019/035049.

*Primary Examiner* — Mesfin T Asfaw
(74) *Attorney, Agent, or Firm* — Patterson + Sheridan, LLP

(57) ABSTRACT

A lithography system for generating grating structures is provided having a multiple column imaging system located on a bridge capable of moving in a cross-scan direction, a mask having a grating pattern with a fixed spatial frequency located in an object plane of the imaging system, a multiple line alignment mark aligned to the grating pattern and having a fixed spatial frequency, a platen configured to hold and scan a substrate, a scanning system configured to move the platen over a distance greater than a desired length of the grating pattern on the substrate, a longitudinal encoder scale attached to the platen and oriented in a scan direction and at least two encoder scales attached to the platen and arrayed in the cross-scan direction wherein the scales contain periodically spaced alignment marks having a fixed spatial frequency.

20 Claims, 7 Drawing Sheets

(52) U.S. Cl.
CPC ...... *G03F 7/70275* (2013.01); *G03F 7/70475* (2013.01); *G02F 2201/30* (2013.01)

(58) Field of Classification Search
CPC .............. G03F 7/70641; G03F 9/7084; G03F 7/70616; G03F 9/7076; G03F 7/201; G03F 9/7088; G03F 7/70633; G03F 9/7046; G03F 7/70725; G03F 7/70625; G03F 7/705; G03F 7/7085; G03F 7/70141; G03F 7/70775; G03F 7/70683; G03F 7/70758; G03F 7/70341; G02B 5/1842; G02B 5/1819; G02F 2201/30; G02F 1/1303; H01L 21/0273; H01L 21/0274; G03B 27/42
See application file for complete search history.

(56) References Cited

U.S. PATENT DOCUMENTS

| | | | |
|---|---|---|---|
| 8,937,710 B2 | 1/2015 | Shibazaki | |
| 2009/0073407 A1 | 3/2009 | Okita | |
| 2009/0268179 A1* | 10/2009 | Park | G03B 27/32 355/53 |
| 2014/0022526 A1 | 1/2014 | Van Eijk et al. | |
| 2017/0336723 A1 | 11/2017 | Shibazaki | |
| 2018/0275533 A1* | 9/2018 | Shirato | G03F 7/2057 |
| 2019/0361358 A1* | 11/2019 | Tel | G03F 7/70683 |

* cited by examiner

SYSTEM FOR MAKING ACCURATE GRATING PATTERNS USING MULTIPLE WRITING COLUMNS EACH MAKING MULTIPLE SCANS

BACKGROUND

Field

Aspects of the disclosure relate to flat panel display manufacturing for various type of electronics. More specifically, aspects relate to systems and methods for manufacturing wire grid polarizers wherein the manufacturing systems that produce such polarizers have grating patterns produced by multiple columns each making multiple scans.

Description of the Related Art

There is a need in every liquid-crystal television set for a set of efficient polarizers each of which is configured to transmit one polarization of light and reflect an orthogonal polarization. These polarizers are approximately the same size as a television picture, thus with ever increasing sizes of televisions, polarizers of greater than 66 inches in diagonal measure are needed. Wire grid polarizers are generally constructed from an array of microscopic wires on a glass substrate (or wafer) which selectively transmit polarized light. Polarizers are a significant cost element for flat panel monitors and such polarizers can account for as much as 30% of the total cost of the flat panel system.

The increasing size of televisions and flat panel monitor systems has stimulated an increase in the size of substrates from which television screens are constructed, with some approaching three meters square in size. In order to be commercially viable, it is necessary to produce fine grating patterns on glass substrates over a desired surface in as little time as possible including the loading and unloading times so that the fine grating patterns meet the specific polarization needs of the electrical device. The size of the grating lines and spaces can be on the order of 50-100 nm, and these grating lines are evenly spaced so as to not cause noticeable defects in the resulting picture created for the user.

In order to expose a grating over such as large area in a relatively short period of time, it is necessary to employ multiple optical columns, each of which write multiple strips of grating pattern. A typical problem with this scheme is achieving and maintaining proper alignment of the projected grating pattern with respect to both the previous grating strip done by the same optical column and with regards to the strips printed by adjacent columns. As a non-limiting example, if the projected grating pattern has 100 nm lines and spaces and the lines in the projected grating are 0.2 mm long, then in order to prevent significant image smearing, the direction of travel of the substrate needs to be aligned to the direction of the grating lines so that the amount of smear is less than 10 nm over a 0.2 mm length. The angular alignment between the direction of the grating lines on the mask and the scan direction of the stage should be within 10 nm/0.2 mm=1 part in 20,000 or about 10.3 seconds of arc. Such angular alignment, in conventional systems, is extremely difficult to achieve and maintain.

Another problem that conventional systems have is that substrate must be stepped in the cross-scan direction with respect to the columns between successive scans with a very accurate precision in order to avoid image smearing where tapered images overlap. If such cross-stepping is not accurately performed, the accumulated error in the last scan will not be aligned correctly with the first scan done by the adjacent column.

There is a need to provide a system and method to allow for making accurate grating patterns using multiple writing columns and to allow for the multiple grating strips generated in each scan to be accurately aligned and uniformly exposed over the entire substrate surface thus providing a polarizing grid having a very high efficiency.

SUMMARY

The following summary should not be considered to limit the aspects of the disclosure.

In one non-limiting embodiment, a lithography system is disclosed comprising multiple imaging systems located on a bridge capable of moving in a cross-scan direction, a mask having a grating pattern with a fixed spatial frequency located in an object plane of each imaging system and a multiple line alignment mark aligned to the grating pattern and having a fixed spatial frequency, a platen configured to hold and position a substrate, a scanning system configured to move the platen over a distance greater than a desired length of the grating pattern on the substrate, a longitudinal encoder scale attached to the platen and oriented in a scan direction and at least two encoder scales attached to the platen and oriented in the cross-scan direction wherein the scales contain periodically spaced alignment marks having a fixed spatial frequency.

In one non-limiting embodiment, a method to perform lithography is disclosed comprising placing a substrate on a platen in a first position, imaging the grating pattern on the substrate while moving the substrate with a scanning system to produce a first scan while using an encoder scale and readouts to define the scan path and angular orientation of the substrate, indexing the bridge holding the optical columns to a second position with respect to the scanning system such that the second position is arranged wherein a second scanning a second exposure strip aligned adjacent with the first exposure strip and thus extending the width of the exposure area.

Other aspects and advantages will become apparent from the following description and the attached claims.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
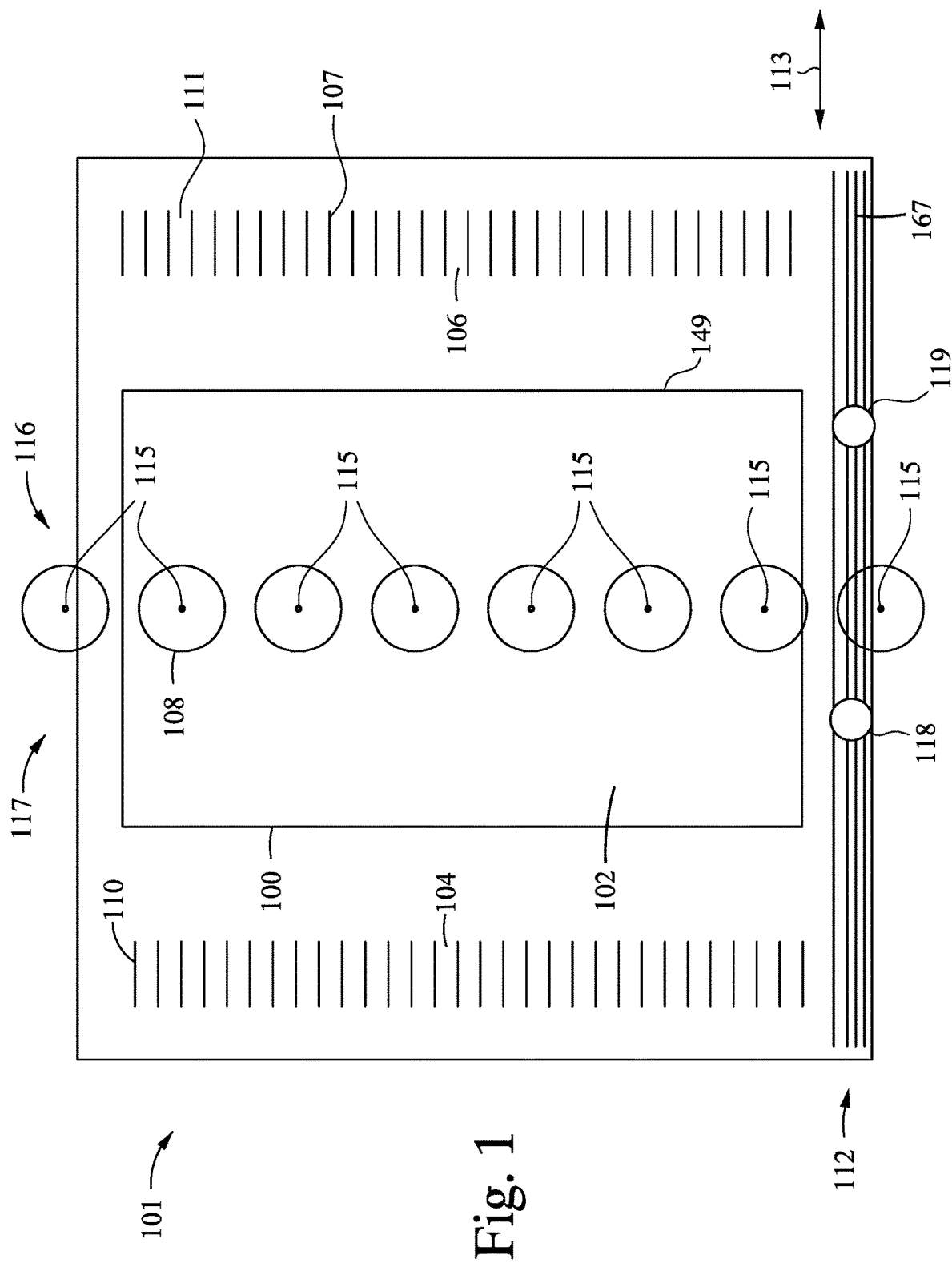
FIG. 1 is a plan view of a system for making accurate grating patterns using multiple writing columns each making multiple scans.

In the following description, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim. Likewise, reference to "the disclosure" shall not be construed as a generalization of an inventive subject matter disclosed herein and shall not be considered to be an element or limitation of the appended claims except where explicitly recited in a claim.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

A system (arrangement) and method for making accurate grating patterns for a wire grid polarizer for a flat panel display is disclosed. The scanning stage may have an acceleration loading limit placed upon the system for various reasons. For example, in the embodiments described, a 0.5 g acceleration loading limit is placed upon the system along with a maximum velocity limit of 2 m/s. Additional constraints may also be imposed. A set of calculations may be performed by system architects to determine the most cost-effective method of processing of the materials and the resulting constraints may differ appreciably from the constraints assumed in the following examples. It should be understood that such calculations are merely illustrative and if greater speeds and accelerations for preparing grating patterns are needed, the calculations can be altered to provide for different results.

To calculate the time duration needed to perform a scan along a typical arrangement (substrate) at a limit of 2 m/s as described and imposed above:

Acceleration/deceleration time (in seconds)=Velocity/acceleration=(2 m/s)/(0.5×9.8 m/s$^2$)=0.408 seconds The time to scan the length of a 3 meter long panel (for a large flat display) at a 2 m/s scan velocity is 1.5 seconds. The total time to accelerate, scan the stage, and decelerate=0.408 sec+1.5 sec+0.408 sec=2.316 seconds.

It can therefore be observed that to cover an entire three (3) meter wide panel with 20 mm wide strips of imagery to create a wire grating pattern requires 150 scans. The total time, therefore, for processing a single 3 by 3 meter square area would be 2.316 seconds per scan×150 scans=347.5 seconds, when only one optical column is used during the writing process. Such single column processing is uneconomical to perform and a more economical alternative is desired.

System designers have found that instead of providing a single column process, a multiple column process where each column is used to make multiple scans can be more economical as provided below. Although described as making multiple scans, the systems and methods may vary the number of scans to achieve a desired efficiency.

To determine a number of scans, for example, that can be used to process a three (3) meter wide thin-film panel, it is assumed that the load and unload times for a stage 101 (with materials) is a total 15 seconds. It is also desired to process an entire substrate completely within one (1) minute in order to achieve compatibility with the other operations in the factory Subtraction yields that the amount of time to process the entire substrate (placing grating patterns onto the substrate) is 1 minute total processing time−15 sec loading and unloading time=45 sec remaining for placement of grating patterns.

The number of columns required to achieve a 45 second scanning time is therefore 347.5 sec/45 sec=7.72 columns which rounds up to eight (8) columns. With eight (8) columns being used in a simultaneous process, only nineteen (19) strips are written by each column. In the illustrated embodiment, therefore, eight (8) columns are used. As one skilled in the art will recognize, a greater number of columns may be used for processing and the processing will be faster.

Referring to FIG. 1, a platen 100, which is movable, supports (holds) a substrate 102. In the illustrated embodiment, the substrate 102 may be a glass substrate with a surface coating that is sensitive to exposure from a lithography process. Vacuum may be used to clamp the substrate 102 to the platen 100. The platen 100 has two encoder scales 104, 106 that may be used to align the bridge containing the optical columns and the position of the image field in each column during processing. The two encoder scales 104, 106 consist of precisely placed alignment targets each consisting of a group of 5 lines. In the illustrated embodiment, the bridge 100 is configured to move in 20 mm steps in a "y" direction of the page. An array of lenses 108 positioned on the bridge is maintained in alignment using the two encoder scales 104, 106 to check the alignment after each stepping motion of the array of lenses 108. The array of lenses 108 may be half Dyson optical imaging systems that include a primary mirror, a positive lens and a reticle.

Alignment targets 110, 111 on the encoder strips 104, 106 are arranged 20 mm apart such that movement of the lens array or the position of an individual lens in the array of lenses 108 is tracked with precision. The array of lenses 108 provide a means for projecting images such as a grating pattern, as necessary, for the embodiments described.

Moving the stage 101 in a straight line is achieved by placing the two encoder scale readouts 118 and 119, mounted to ground and aligned to the desired scanning direction along one side of the platen 100 or chuck and deriving a signal therefrom that serves to align the scan direction with the center of the encoder pattern 167. Scanning the stage 101 or stepping the bridge containing the optical columns can be done by computer control such that successive scans performed on the substrate 102 are aligned. The scanning system 149 is configured to move back and forth precisely on a straight line and after each scan the bridge is stepped in the cross-scan direction to position the grating images for exposing the next strip. Each step corresponds to a fixed, integral number of grating periods. This can be done using an accurate encoder to obtain a distance and then registering the projected grating pattern alignment target against an alignment pattern built into the platen 100 or chuck so the distance can then be used to reposition the position of the column with respect to the substrate at the ends of the scan travel.

In the illustrated embodiment, a grating image with 100 nm lines and spaces is generated by imaging a grating pattern on a mask having 200 nm lines and spaces with a 0.8875 NA, half Dyson optical imaging system 116 using a laser 115 which as a wavelength of 355 nm. By eliminating any zero order diffraction from the image, the spatial frequency of the image is doubled. Such a system 116 is used to produce images for the lithography system 117. The laser 115 has a single lateral mode and may be used to create a diffraction limited image. The exposure may also be tapered at the ends of the grating pattern image and overlapped with a tapered edge of a strip of imagery with another strip so that slight registration errors between adjacent scans do not generate sharp discontinuities discernable by the human eye. A grating image width of 20 mm may be readily obtained from a modestly sized optical column containing a 1:1 Dyson imaging system.

FIG. 1 illustrates the two encoder scales 104, 106 and their positions on the platen 100 or chuck in order to keep the stepping increment of the bridge constant and to ensure that a stepping error does not appreciably blur the overlap area where the scans overlap slightly. In this case, the platen 100 moves back and forth along a single axis called the scan axis 112, which defines a scan direction 113, which is horizontal in FIG. 1, and the bridge containing the optical columns is stepped in the vertical direction to separate the grating strips exposed in successive scans. A longitudinal encoder scale 167 containing the long lines extending along the bottom of the platen 100 serves to define the scan path and to prevent any platen 100 rotation during the scan. Two read out arrangements, 118 and 119, are positioned along the encoder scale 167 which provide the signals defining the scan path and inhibit platen rotation. The platen 100 position in the vertical direction in FIG. 1 is obtained by summing the 2-encoder readout arrangements. Platen rotation is proportional to the difference in the two readouts. By maintaining the sum and difference at constant values, the scan direction and the platen rotation are held steady during scanning. As will be understood by those skilled in the art, it is desired to maintain platen rotation to a minimum. The bridge containing the optical columns may then be stepped to a position where a second scan may be performed. Performing a scan may be controlled by a computer or other similar arrangement.

The two encoders 104, 106 located at either end of the platen 100 contain a series of 5-line grating patterns 107 that may be used as alignment targets. When an alignment target incorporated into a mask is imaged onto and scanned over one of the alignment targets on the platen, an alignment signal is generated and processed to yield an offset between the actual and ideal positions of the next grating strip. This error can be corrected either my moving the entire bridge, which changes the position of the images generated by every column or by tilting the primary mirror in the column generating the offset so the mask target image is perfectly centered on the platen target in the cross-scan direction. Fine adjustment can be made by slightly tilting a primary mirror in the projection system to slightly shift the position of the projected image. Coarse adjustments require repositioning the optical column. The two vertical encoder scales 104, 106 at either end of the platen 100 have to be adjusted so that an off-set error measured on one end corresponds to an identical error on the other end.

The Dyson Alignment System

A mask 204 in the Dyson alignment system contains a 200 nm line and space grating pattern roughly 20 mm in length and 0.2 mm at a maximum width. In the embodiment illustrated, the lines in the grating pattern are accurately aligned with the scan direction, according to a two-step process, otherwise the grating image will be smeared as the lines are scanned across the substrate.

Aligning the grating line direction with the scan direction encompasses a first step whereby a substrate containing a 5-line target extending from one side of the substrate to the other is aligned to the scan direction using a theta adjustment provided in the platen. This is done by measuring the cross-scan position of the substrate target at a fixed point in the Dyson field and at various scan positions. Any difference in the substrate target position indicates a misalignment between the direction of the substrate target and the scan direction, which can be corrected by adjusting the orientation of the substrate. Once the substrate target is properly aligned, it is used to align the orientation of the object grating pattern. In this case the substrate is held still and the point in the Dyson field used to measure the offset is varied and the Dyson mask is rotated until a null position is achieved.

Figure 2:
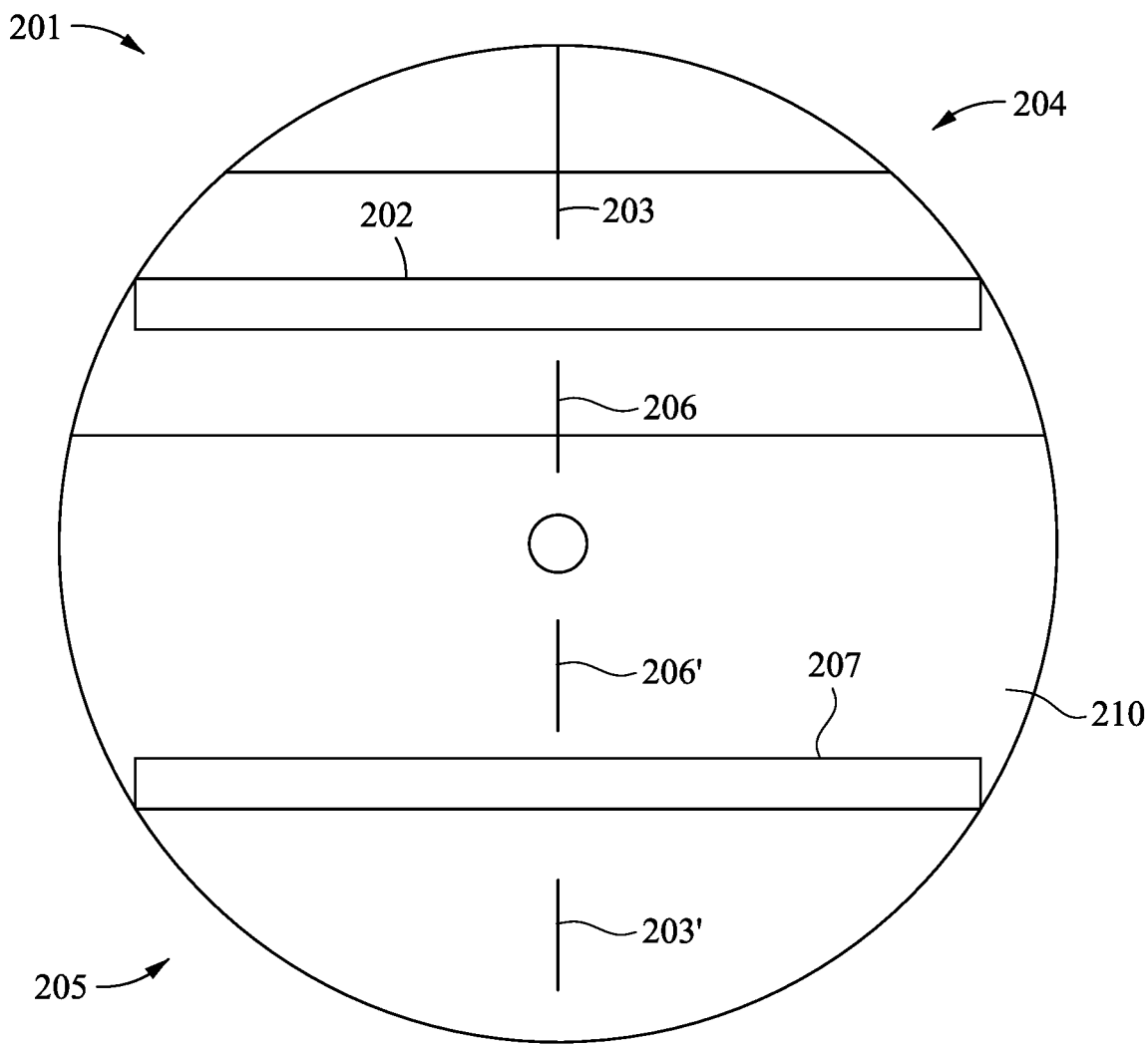
FIG. 2 is a plan view of a Dyson phase shifting, reflective reticle used in a Dyson imaging system, which identifies the main features on the reticle.

FIG. 2 is a schematic of the Dyson reticle 201 used in the Dyson imaging system 205 used to making accurate grating patterns. In this example, an aluminized phase grating pattern 202 consists of 200 nm lines and spaces and the narrow line extending vertically down the center of the mask 204 is the mask alignment target, which contains five lines 203 each 200 nm wide and spaced 400 nm apart. The grating pattern 202 has a fixed spatial frequency. The five-line alignment target 203 on the Dyson mask 204 can be illuminated with a narrow beam of illumination having the same wavelength as is used to form the grating image. The beam of illumination can be switched from a position 6 mm above the grating to a position 6 mm below. The two horizontal lines in FIG. 2 indicate the two possible positions for the focused laser beam on the mask pattern. The mask pattern is illuminated with a Gaussian beam that would result in a very non-uniform exposure if the grating lines were all the same length. Consequently the grating lines are made shorter in the center than at the ends in order to achieve a constant exposure dose across the width of the field. The image of the grating is projected through a window on the mask 207, located on the opposite side of the system axis, which is centered in the small circle of FIG. 2. The substrate focal plane is immediately below the mask object plane, the illuminated positions of the mask alignment target are also projected through the mask on the opposite side of the optical axis. Thus target 203 is imaged at 203' and target 206 is imaged at 206'.

Figure 3:
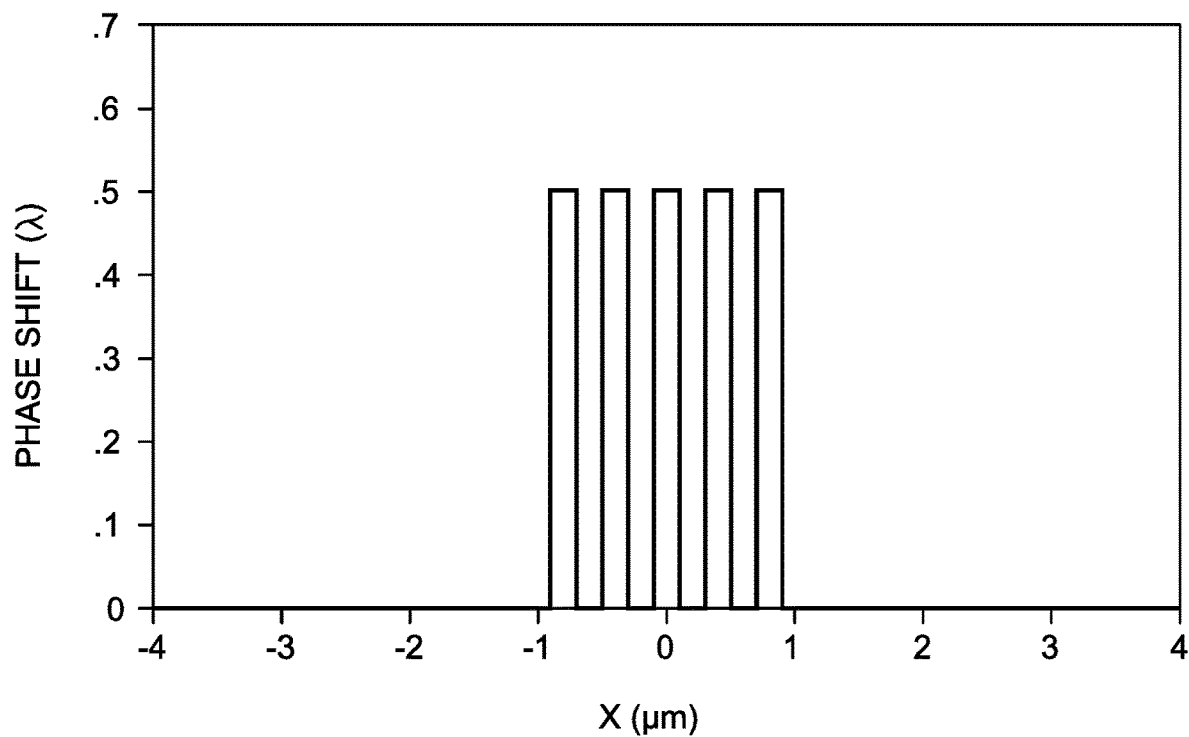
FIG. 3 is a cross-section of an alignment grating target contained on a Dyson system mask. Ideally this target is also fabricated as a reflective phase shift device.
Figure 4:
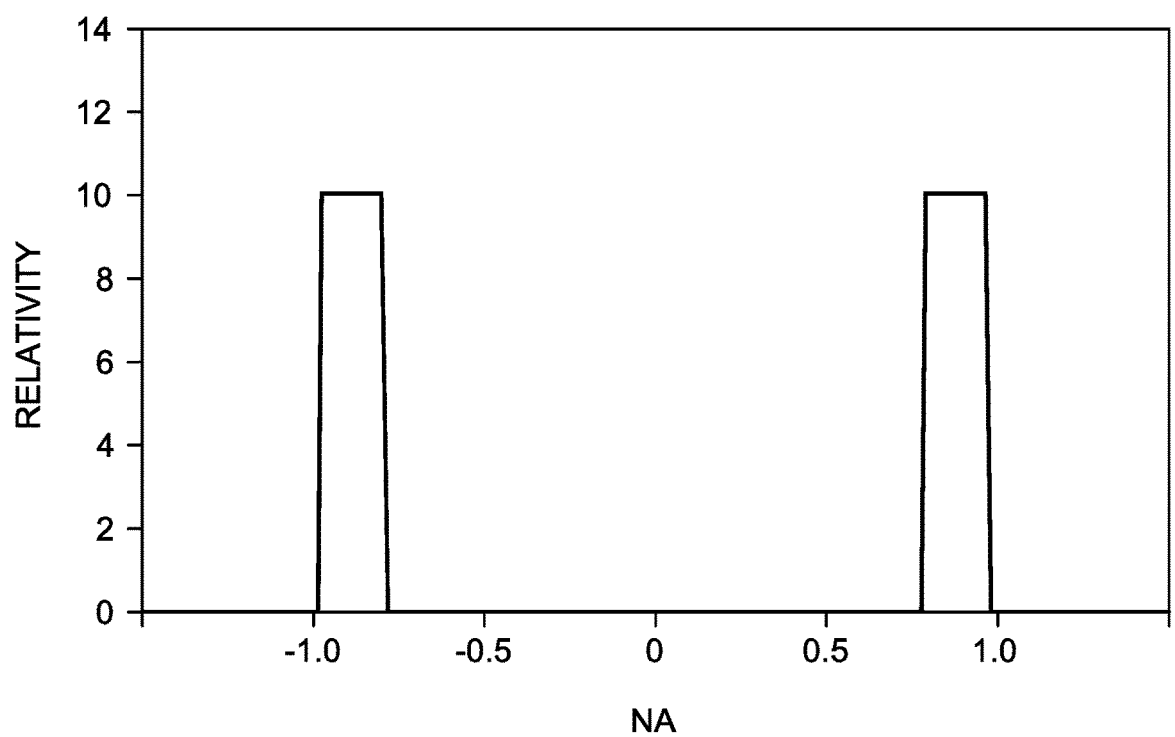
FIG. 4 is a depiction of the two reflective areas on a Dyson primary that collect the diffraction orders from the mask target and image the orders onto a similar target contained on either end of the platen.

FIG. 3 depicts a cross-section of the alignment target contained on the Dyson mask, and FIG. 4 depicts the two small reflective areas on the Dyson primary that collect the ±1 diffraction orders from the mask target and image them onto the substrate. The zero diffraction order is lost. As can be seen in FIG. 3, the five lines of the target are presented along a displacement axis (x) in um. The center line of the five line group is centered along the x(um) value of 0.

Figure 5:
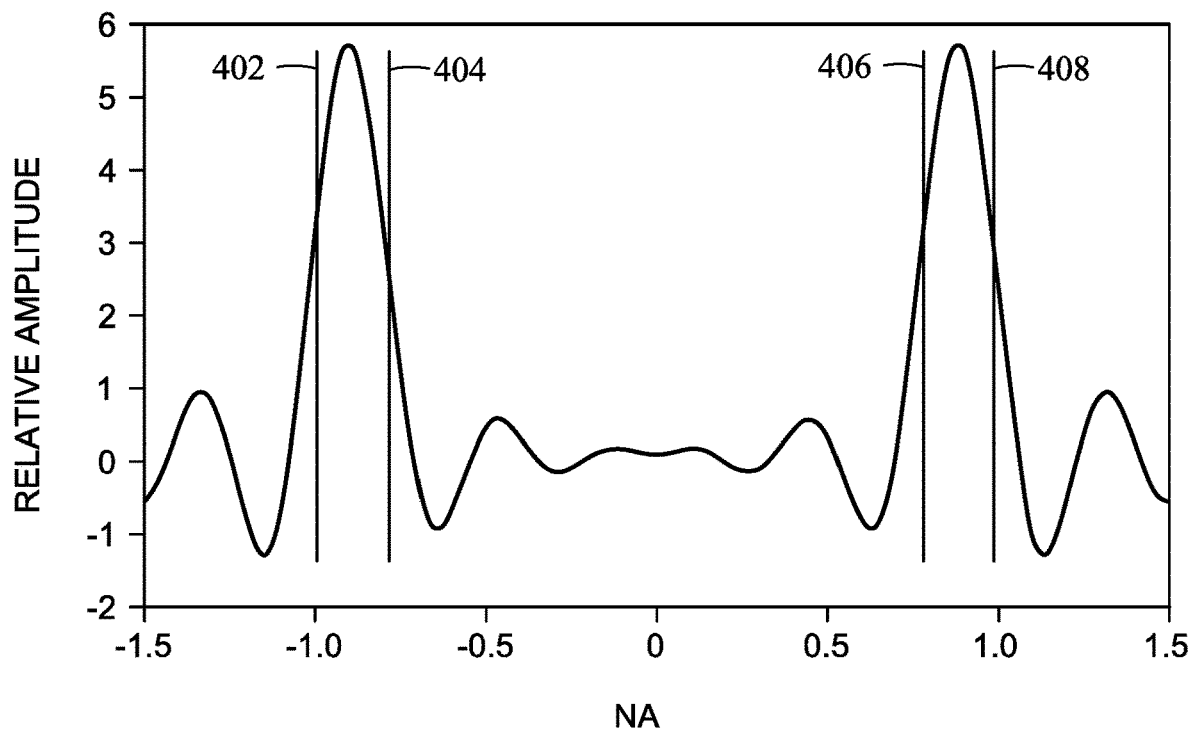
FIG. 5 illustrates the amplitude of the diffraction orders created by alignment target at the pupil of the primary mirror surface of the Dyson system. Only two portions near the two peaks are reflected to form the image of the alignment target on the platen.
Figure 6:
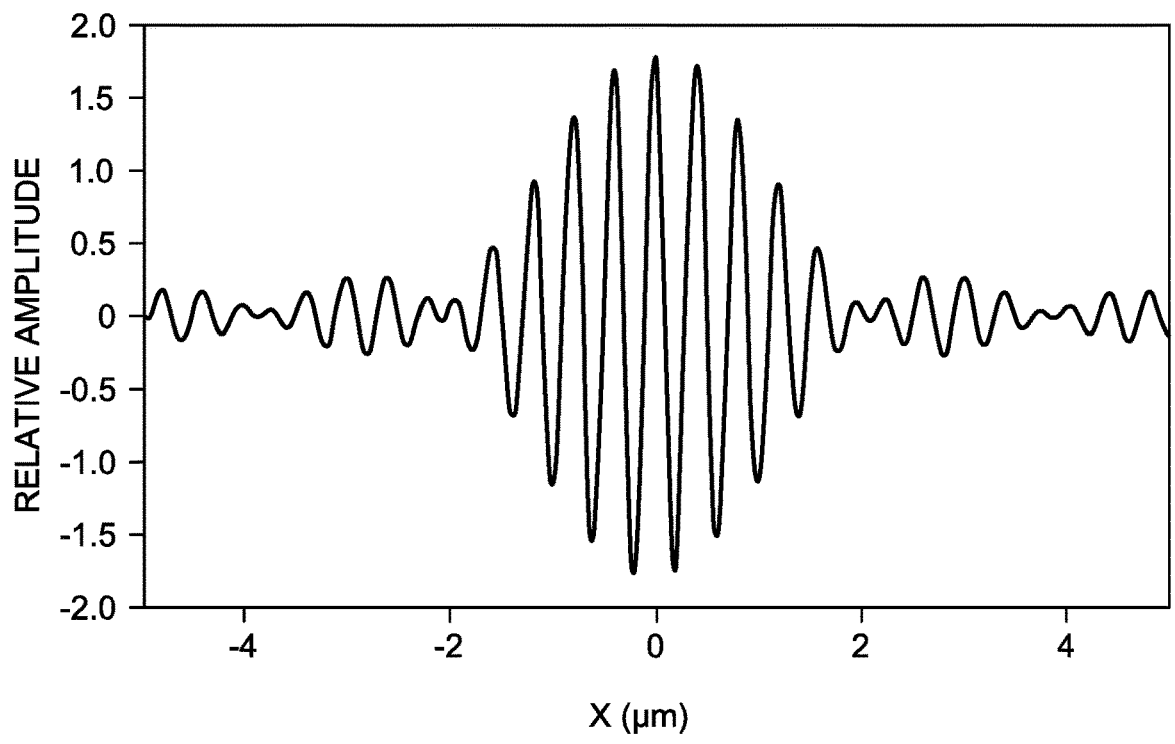
FIG. 6 is the image amplitude on the platen that results from the truncated amplitude reflected from the primary mirror.

FIG. 5 illustrates the amplitude of the ±1 diffraction orders at the pupil of the primary mirror surface. Since the reflective area on the Dyson primary mirror is confined to 2 small reflective areas, as illustrated in FIG. 4 (ending at −1.0 NA and 1.0 NA), the diffraction amplitude spectrum is truncated between the bold vertical lines 402, 404, 406, 408 on FIG. 5. The resulting amplitude image taking into account the truncated diffraction amplitude spectrum is shown in FIG. 6. This pattern is essentially a fringe pattern in which the amplitude envelope is determined by the numerical aperture of the reflector at the primary mirror.

Figure 7:
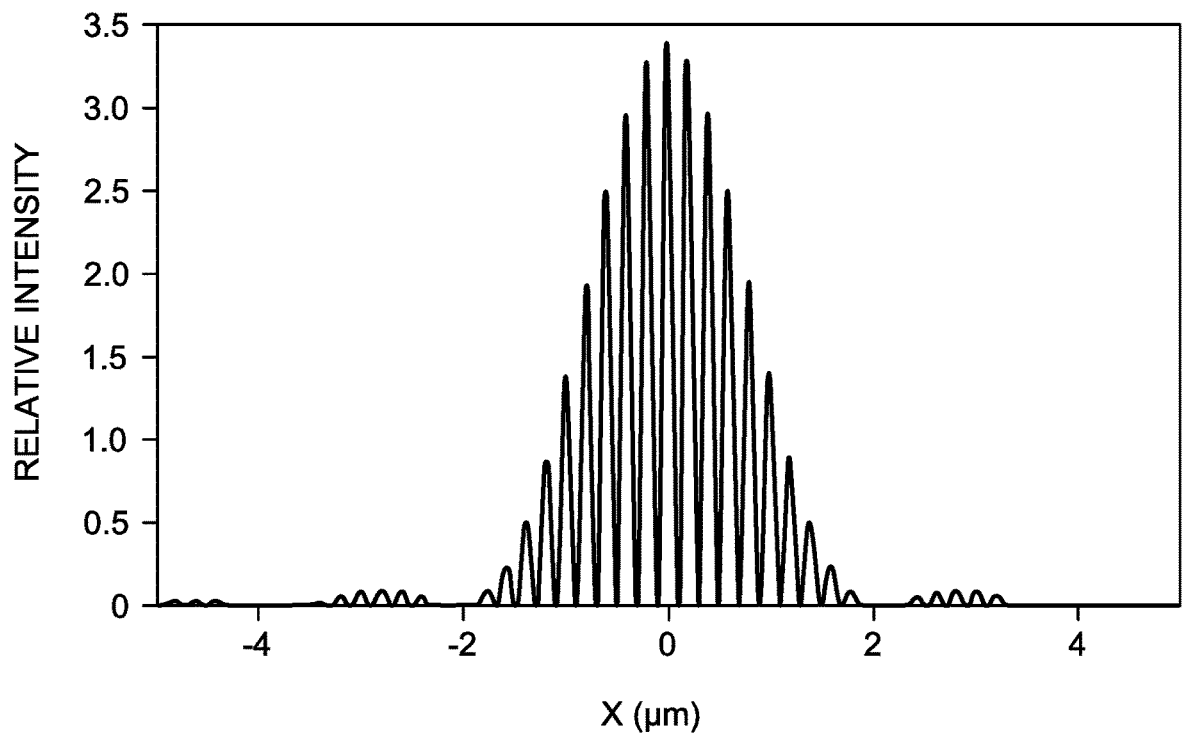
FIG. 7 is a graph of resultant target image intensity generated by the amplitude shown in FIG. 6 wherein the loss of the zero order has resulted in doubling the modulation frequency shown in FIG. 6.
Figure 8:
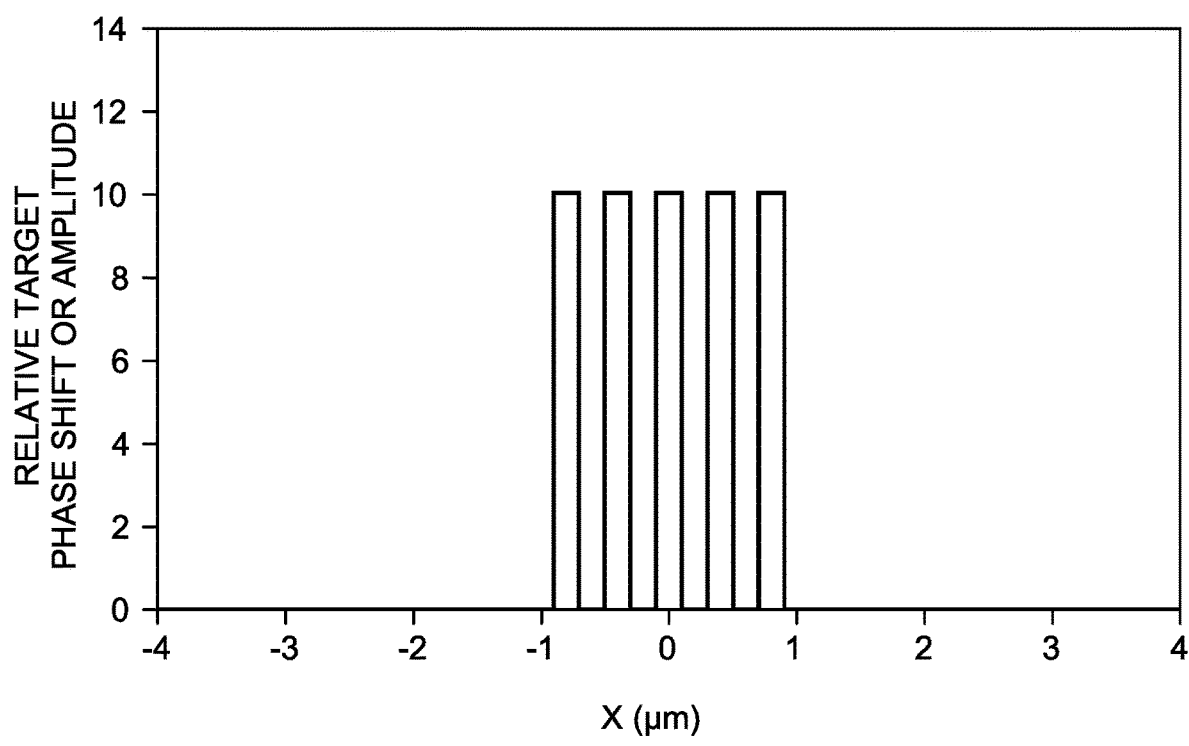
FIG. 8 is a graph representing the target on the platen that is repeated to form the encoder pattern on either end of the platen wherein the reflective pattern can employ either phase of amplitude modulation characteristics.

FIG. 7 illustrates the resultant intensity of the mask target image, having double the frequency of the amplitude spectrum shown in FIG. 6, which results from squaring the amplitude spectrum. FIG. 8 represents the amplitude or reflected intensity from the platen target on which the mask target image is superimposed. The detector signal depends on a sum of the sampled amplitudes squared and this sum can clearly be positive, negative or zero depending on the relative positions of the projected mask alignment target and the alignment target on the platen 100. Squaring these values inverts the negative signals and doubles the frequency, but the zero values remain.

Figure 9:
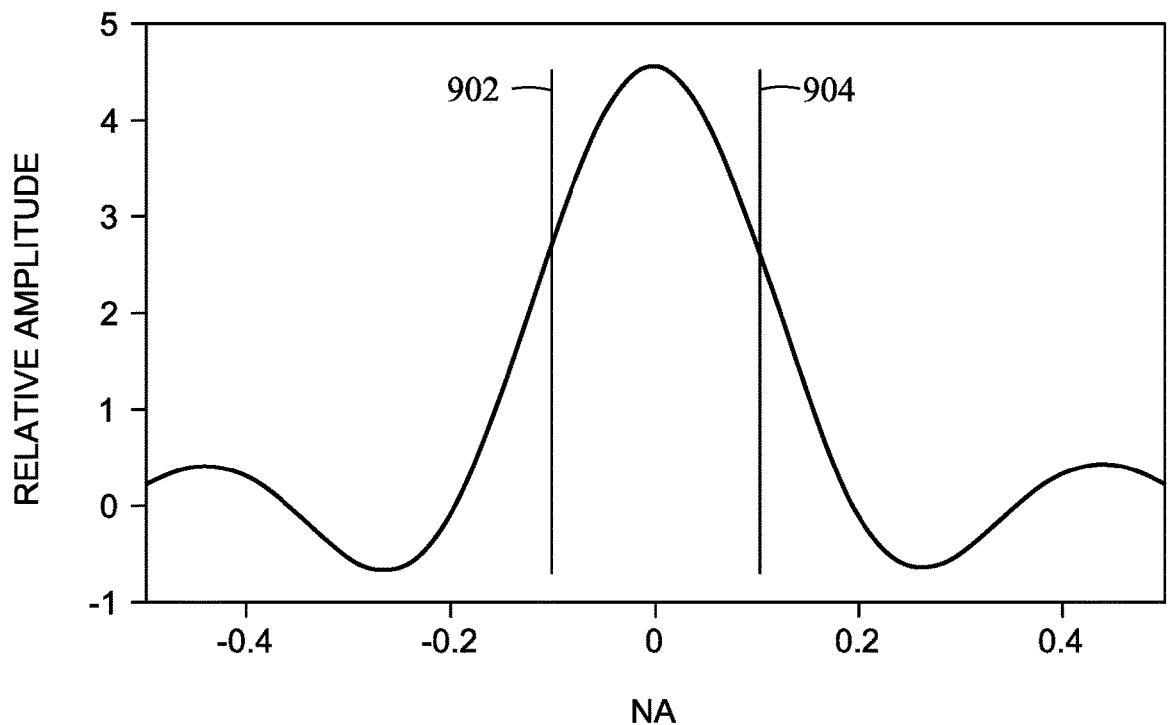
FIG. 9 is a graph of the zero order diffraction amplitude at the pupil of the Dyson system. The zero order is generated by reflection of the mask target image from the matching target on the platen.
Figure 10:
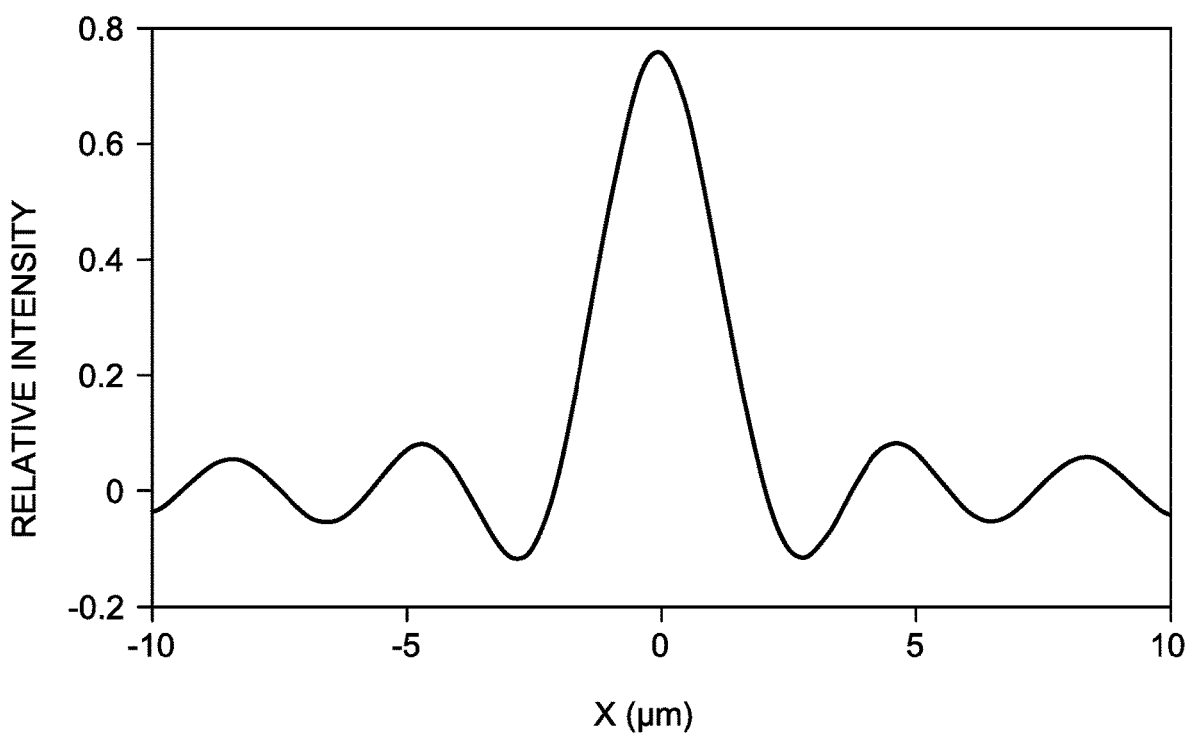
FIG. 10 is a graph of the amplitude at a detection plane, where the mask and platen targets are imaged.
Figure 11:
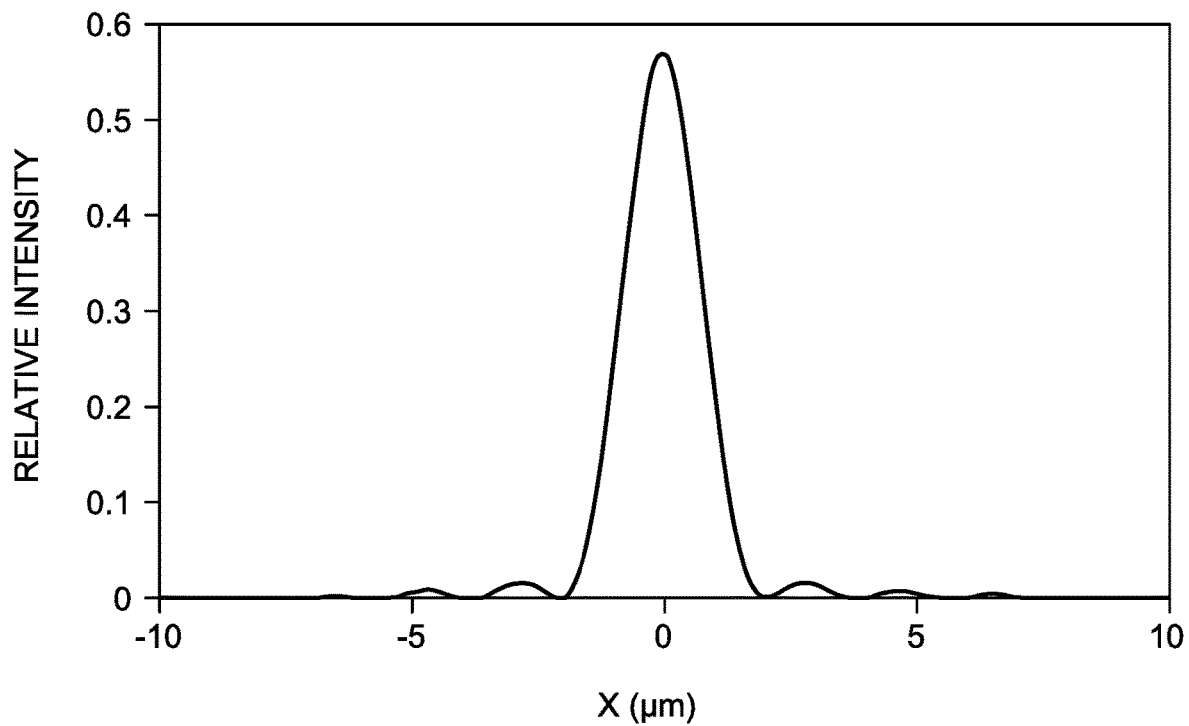
FIG. 11 is a graph of intensity at a detector plane, when the targets are aligned.
Figure 12:
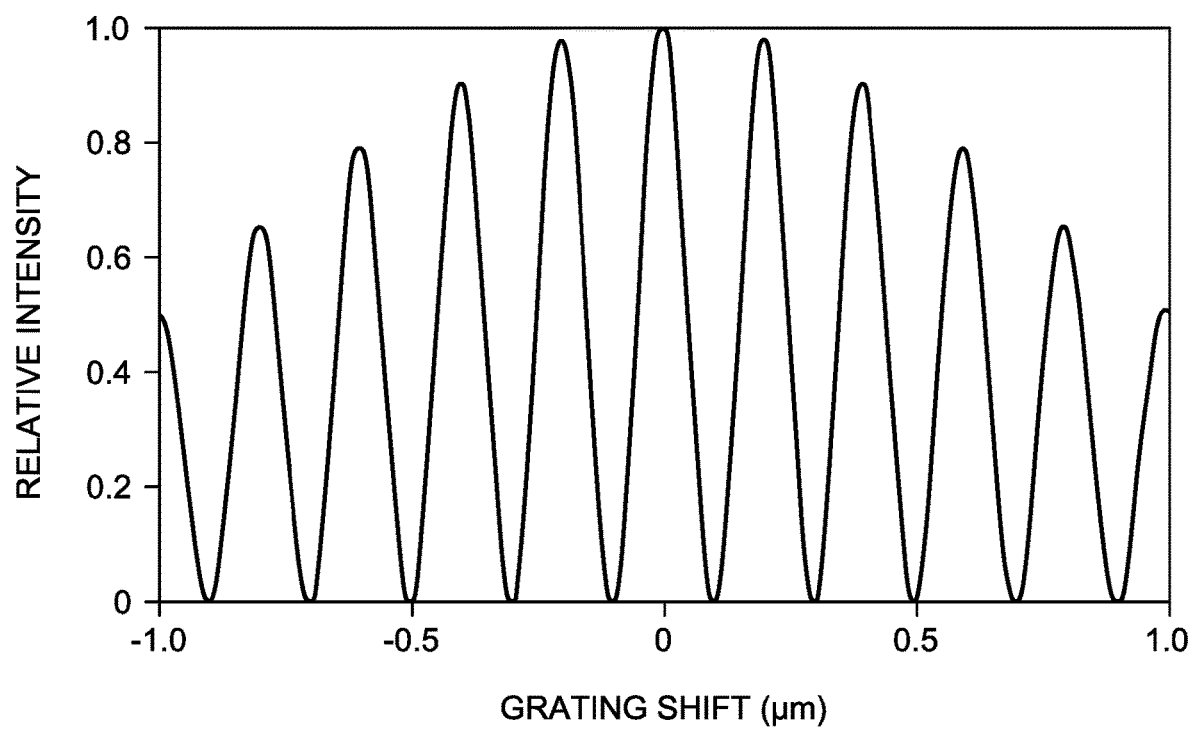
FIG. 12 is a graph of signal intensity vs. the lateral shift between the mask target and the target on the platen.

FIG. 9 shows the amplitude of a diffraction-limited signal from a 1.8 micron wide line at the collection optics located on the axis of the projection system and slightly behind the Dyson primary vertex. The bold vertical lines 902, 904 in FIG. 9 indicate that there is appreciable truncation at the collection aperture, which results in the amplitude distribution shown in FIG. 10 and the intensity distribution shown in FIG. 11. Scanning the image of the five line mask 204 target across the matching 5-line target on the substrate generates the signal shown in FIG. 12. Scanning is done by tilting the primary mirror of the Dyson system about the mirror vertex in the cross-scan direction with a precision motorized micrometer. The center peak of this signal is easily identified, and is about 200 nm wide. As a result, the mask target position is clearly defined with respect to the platen target and can be measured to within ±5 nm.

A challenge of writing with multiple columns concurrently is that after writing 18 strips, the $19^{th}$ strip must overlay the first strip written by the adjacent column within ±10 nm. This requires that the center of the image produced by each column is precisely spaced with respect to the image centers of the adjacent columns. This is achieved by incorporating a 5 line grating target into the mask pattern used to form the grating image and by placing similar 5 line grating target at selected points along the two encoder scales shown in FIG. 1. The vertical calibration scale serves to position the projected pattern positions of each column and the position of each strip written by each column.

In one non-limiting embodiment, a lithography system is disclosed having an imaging system optical column located on a bridge capable of moving in a cross-scan direction, a mask having a grating pattern with a fixed spatial frequency located in an object plane of the imaging system, a multiple line alignment mark aligned to the grating pattern and having a fixed spatial frequency, a platen configured to hold and scan a substrate, a scanning system configured to move the platen over a distance greater than a desired length of the grating pattern on the substrate, a longitudinal encoder scale attached to the platen and oriented in a scan direction and at least two encoder scales attached to the platen and arrayed in the cross-scan direction wherein the scales contain periodically spaced alignment marks having a fixed spatial frequency.

In another non-limiting embodiment, the arrangement is provided wherein the imaging system is a Dyson optical imaging system.

In another non-limiting embodiment, the arrangement may be provided wherein the Dyson optical imaging system is a half Dyson optical imaging system.

In another non-limiting embodiment, the arrangement may further comprise a laser illumination source. More specifically, the laser illumination source is configured to generate a single T,0,0 lateral mode.

In another non-limiting embodiment, the arrangement may be provided wherein at least one of the two encoder scales is arrayed in the cross-scan direction to position in the cross-scan direction, every projected strip of grating pattern.

In another non-limiting embodiment, the arrangement may further comprise an alignment system configured to view an image of a mask alignment target superimposed on a similar target contained in the array of targets on the encoder strip attached to the platen thereby generating a beam that is modulated as the mask alignment mark image is moved across the encoder mark.

In another non-limiting embodiment, the arrangement may be configured wherein the mask and platen alignment marks comprises from 3 to 7 equi-spaced lines having the same period as the grating pattern on the mask.

In another non-limiting embodiment, the arrangement may further comprise a metrology system connected to the platen and configured to enable the platen to repeatedly move along a the same straight path while maintaining a fixed angular orientation with respect to an axis normal to the substrate surface.

In another non-limiting embodiment, the arrangement may further comprise at least two half-field Dyson optical columns configured to write simultaneously and arranged such that grating pattern strips written by each of the optical columns are equally spaced in the cross-scan direction and form a continuous grating pattern once all the stripes are written.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A lithography system comprising:
an imaging system located on a bridge capable of moving in a cross-scan direction;
a mask having a grating pattern with a fixed spatial frequency located in an object plane of the imaging system and a multiple line alignment mark aligned to the grating pattern and having a fixed spatial frequency;
a platen disposed on a movable stage and configured to hold a substrate;
a scanning system configured to move the platen in a scan direction over a distance greater than a desired length of the grating pattern on the substrate, the scanning system further configured to move the platen in the cross-scan direction;
a longitudinal encoder scale attached to the platen along a first side of the platen and oriented in the scan direction; and
at least two encoder scales attached to the platen and arrayed in a cross-scan direction, wherein the at least two encoder scales contain periodically spaced alignment marks having a fixed spatial frequency, the at least two encoder scales comprising a first encoder scale along a second side of the platen and a second encoder scale along a third side of the platen opposing the second side, and the longitudinal encoder scale extending between the first encoder scale along the second side and the second encoder scale along the third side.

2. The system according to claim 1, wherein the imaging system is a Dyson optical imaging system.

3. The system according to claim 2, wherein the Dyson optical imaging system is a half Dyson optical imaging system.

4. The system according to claim 1, further comprising: a laser illumination source.

5. The system according to claim 4, wherein the laser illumination source is configured to have a $TM_{00}$ lateral mode.

6. The system according to claim 1, wherein at least one of the at least two encoder scales is arrayed in the cross-scan direction to position in the cross-scan direction, every projected strip of the grating pattern.

7. The system according to claim 1, further comprising:
an alignment system configured to view an image of an alignment mark from a mask imaged on an encoder mark thereby generating a beam that is modulated as the alignment mark is moved across the encoder mark.

8. The system according to claim 7, wherein the alignment mark comprises from 3 to 7 equi-spaced lines having a same period as the grating pattern on the mask.

9. The system according to claim 1,
wherein the longitudinal encoder scale oriented in the scan direction and the at least two encoder scales arrayed in the cross-scan direction facilitate a platen path along a straight line, the longitudinal encoder scale and the at least two encoder scales further configured to facilitate a platen orientation constant with respect to an axis normal to the platen.

10. The system according to claim 1, wherein the imaging system is configured to produce two images simultaneously.

11. A method to perform lithography, comprising:
placing a substrate on a platen in a first position, the platen comprising:
a longitudinal encoder scale attached to the platen along a first side of the platen and oriented in a scan direction;
a first encoder scale attached to the platen along a second side of the platen and arrayed in a cross-scan direction; and
a second encoder scale attached to the platen along a third side of the platen opposite the second side and arrayed in a cross-scan direction, the first and second encoder scales each comprising periodically spaced alignment marks having a fixed spatial frequency, and the longitudinal encoder scale extending between the first encoder scale along the second side and the second encoder scale along the third side;
imaging a grating pattern on the substrate with an imaging system while moving the platen with a scanning system to produce a first strip of imagery while using a metrology system to ensure that the platen travels in a straight line without rotating about an axis normal to the substrate surface; and
indexing the imaging system in the cross-scan direction to a second position such that the second position is arranged wherein a second scanning results in a second strip of grating imagery aligned with the first strip of imagery.

12. The method according to claim 11, further comprising:
using the longitudinal encoder to ensure the scanning system moves without rotating the platen about an axis normal to the substrate surface.

13. The method according to claim 11, wherein the imaging is performed with a Dyson imaging system.

14. The method according to claim 11, further comprising:
using an alignment system to check an alignment of the platen to the encoder.

15. The method according to claim 11, wherein the imaging is performed with a half Dyson optical imaging system.

16. The method according to claim 11, wherein a movement of the substrate is approximately 2 m/s.

17. The method according to claim 11, further comprising:
using an alignment system to check an alignment of the platen to the longitudinal encoder and the first and second encoder scales.

18. A method to align a substrate on a platen for performing lithography, comprising:
placing the substrate on the platen in a first position, the platen comprising:
a longitudinal encoder scale attached to the platen along a first side of the platen and oriented in a scan direction;
a first encoder scale attached to the platen along a second side of the platen and arrayed in a cross-scan direction; and
a second encoder scale attached to the platen along a third side of the platen opposite the second side and arrayed in a cross-scan direction, the first and second encoder scales each comprising periodically spaced alignment marks having a fixed spatial frequency, and the longitudinal encoder scale extending between the first encoder scale along the second side and the second encoder scale along the third side;

imaging a mask with an alignment target onto an alignment target on the platen;
generating an alignment signal based upon the imaged mask and the alignment target; and
tilting a primary mirror in a column based on the alignment signal to center the image of the mask alignment target on to the alignment target on the platen.

19. The method of claim 18, further comprising:
scanning an image of the mask alignment target across the alignment target on the substrate, wherein the scanning is performed by the tilting primary mirror;
receiving image data from the scanning of the image of the mask across the substrate;
identifying a center peak position of the received image data to the alignment target on the substrate to calculate a deviation; and
aligning the mask alignment target to align with the substrate according to the deviation.

20. The method according to claim 18, wherein the imaging is performed with a Dyson imaging system.

* * * * *